(12) United States Patent
Maurin-Perrier et al.

(10) Patent No.: US 8,859,078 B2
(45) Date of Patent: Oct. 14, 2014

(54) FRICTION PIECE IN A LUBRICATED MEDIUM, WORKING AT CONTACT PRESSURES HIGHER THAN 200 MPA

(75) Inventors: Philippe Maurin-Perrier, Saint Marcellin en Forez (FR); Florent Ledrappier, Saint-Etienne (FR); Louis Mourier, Saint-Etienne (FR); Christophe Donnet, Saint-Etienne (FR); Eric Audouard, Solignac sous Roche (FR); Denis Mazuyer, Ecully (FR)

(73) Assignees: H.E.F., Andrezieux Boutheon (FR); Universite Jean Monet, Saint-Etienne Cedex (FR); Centre National de la Recherche Scientifique, Paris (FR); Ecole Central de Lyon, Ecully (FR)

( * ) Notice: Subject to any disclaimer, the term of this patent is extended or adjusted under 35 U.S.C. 154(b) by 570 days.

(21) Appl. No.: 12/444,167

(22) PCT Filed: Oct. 19, 2007

(86) PCT No.: PCT/FR2007/052204
§ 371 (c)(1), (2), (4) Date: May 22, 2009

(87) PCT Pub. No.: WO2008/047062
PCT Pub. Date: Apr. 24, 2008

(65) Prior Publication Data
US 2010/0024592 A1 Feb. 4, 2010

(30) Foreign Application Priority Data
Oct. 20, 2006 (FR) ..................................... 06 54414

(51) Int. Cl.
*B32B 3/12* (2006.01)
*C23C 14/58* (2006.01)
(Continued)

(52) U.S. Cl.
CPC ............ *B23K 26/0084* (2013.01); *F16H 55/06* (2013.01); *F16H 53/06* (2013.01); *C23C 14/5873* (2013.01); *F16C 2240/40* (2013.01);
(Continued)

(58) Field of Classification Search
USPC .................................... 74/457, 569; 428/141
See application file for complete search history.

(56) References Cited

U.S. PATENT DOCUMENTS 4,573,690 A 3/1986 DeHart et al.
4,620,803 A 11/1986 Vezirian
(Continued)

FOREIGN PATENT DOCUMENTS

JP 2001165167 A 6/2001
JP 2004360011 A 12/2004

OTHER PUBLICATIONS

Mourier et al., "Transient increase of film thicknes in micro-textutured EHL contacts", Mar. 31, 2006, Science Direct, Triboloby International, 39, pp. 1745-1756.*

(Continued)

*Primary Examiner* — David M Fenstermacher
*Assistant Examiner* — Terence Boes
(74) *Attorney, Agent, or Firm* — Heslin Rothenberg Farley & Mesiti P.C.

(57) ABSTRACT

Friction part in a lubricated medium working at contact pressures above 200 MPa and having a contact surface that is textured and subjected, before or after texturizing, to a case hardening treatment for a tribological function, wherein the surface is subjected to operations for producing a periodic network of micrometric cavities having predefined shapes and sizes and a period adapted to the width of the contact surface in order to promote passage to elastohydrodynamic lubrication regime.

17 Claims, 4 Drawing Sheets

(51) Int. Cl.
  *B23K 26/00*   (2014.01)
  *C23C 14/06*   (2006.01)
  *B23K 26/06*   (2014.01)
  *F16H 55/06*   (2006.01)
  *F16H 53/06*   (2006.01)
  *F16C 33/14*   (2006.01)
  *F16C 33/10*   (2006.01)
  *F01L 1/16*   (2006.01)
  *F01L 1/18*   (2006.01)

(52) U.S. Cl.
  CPC ............ *F16C 33/14* (2013.01); *F01L 2820/01* (2013.01); *F16C 33/103* (2013.01); *C23C 14/0605* (2013.01); *B23K 26/0635* (2013.01); *F01L 1/16* (2013.01); *F01L 1/18* (2013.01)
  USPC ............................................ 428/141; 74/569

(56) References Cited

U.S. PATENT DOCUMENTS

| | | | | |
|---|---|---|---|---|
| 5,834,094 | A * | 11/1998 | Etsion et al. | 428/156 |
| 5,952,080 | A * | 9/1999 | Etsion et al. | 428/156 |
| 6,729,286 | B2 * | 5/2004 | Onishi et al. | 123/90.48 |
| 6,732,606 | B1 * | 5/2004 | Zhu et al. | 74/460 |
| 6,886,521 | B2 | 5/2005 | Hamada et al. | |
| 2002/0104506 | A1 | 8/2002 | Ederer | |
| 2005/0175837 | A1 | 8/2005 | Massler et al. | |
| 2005/0217415 | A1 | 10/2005 | Hofmann | |

OTHER PUBLICATIONS

International Search Report for PCT/FR2007/052204 dated Apr. 1, 2008.

* cited by examiner

FRICTION PIECE IN A LUBRICATED MEDIUM, WORKING AT CONTACT PRESSURES HIGHER THAN 200 MPA

CROSS REFERENCE TO RELATED APPLICATIONS

This application is a national stage filing under section 371 of International Application No. PCT/FR2007/052204 filed on Oct. 19, 2007, and published in French on Apr. 24, 2008 as WO 2008/047062 and claims priority of French application No. 0654414 filed on Oct. 20, 2006, the entire disclosure of these applications being hereby incorporated herein by reference.

BACKGROUND ART

The invention relates to the technical field of tribology in lubricated medium.

More particularly, the invention relates to coatings and surface treatments designed to reduce wear and to minimize the transmission of tangential forces.

Numerous technical solutions have been proposed for improving the tribological performance of mechanical parts. A distinction is made essentially between conventional case hardening treatments and deposits of thin and hard layers obtained by various methods such as PVD (Physical Vapour Deposition) or PACVD (Plasma Assisted Chemical Vapour Deposition).

Among the deposits of thin and hard layers, mention can be made of deposits of transition metal nitrides (TiN, CrN, TiAlN, etc.), coatings of amorphous carbon (DLC), etc. For technical, as well as mechanical reasons, it appears that these deposits of surface coatings do not generally exceed 5 µm. Above this thickness, risks of embrittlement of the layer and flaking may occur. It is also important to obtain perfect adhesion and strength of the thin layer over time. Thus, a person skilled in the art claims very slightly irregular surface textures with a roughness (Ra) of about 0.04 µm.

It therefore appears from the prior art that the tribological performance of the surface treatments and vacuum deposits are only guaranteed with surfaces having a slight roughness.

For example, mention can be made of the teaching of U.S. Pat. No. 6,886,521, which sets a maximum value of the surface roughness parameter (Rz) as a function of the hardness of the DLC deposit and the thickness thereof.

In the field of tribology, numerous investigations have been conducted on the influence of the topography of the contact surfaces on the establishment of a hydrodynamic lubrication regime. Thus, it has been proposed to carry out a texturizing of bearings or thrust bearings in order to promote the separation of the surfaces by an improved lubricant bearing capacity. Mention can be made, for example, of the teaching of documents U.S. Pat. No. 5,952,080 and WO2004/063533.

However, the dimensioning of the surface topography is not a simple matter, so that this solution is incompatible with severe contact conditions, and also in the case of heavily loaded friction parts, that is, where the contact pressures give rise to operation in conditions called elastohydrodynamic regime. In fact, this texturizing, which is equivalent to etching patterns on the contact surface, causes a significant decrease in the bearing surface area, so that an unsuitable texturizing inevitably causes a drop in pressure of the oil film and damage to the surfaces, which militates against the desired objective.

It follows that the principle of surface texturizing is not applied by a person skilled in the art except in cases of slightly loaded friction parts in lubricated medium.

Based on the analysis of this prior art, one of the problems that the invention proposes to solve is to be able to apply the principle of the texturizing of a friction surface in order to prolong the existence of an elastohydrodynamic lubrication regime between friction parts in lubricated and heavily loaded medium, that is, working under contact pressures, for example, above 200 MPa.

In fact, above a certain contact pressure threshold, the exponential increase in the viscosity of the lubricant (several orders of magnitude) radically alters its physical behaviour. The lubricant then changes state, and behaves in a manner closer to that of a solid than a fluid. The complete separation of the contact surfaces is then permitted by the elastic deformation of the opposing surfaces, under the action of the lubricant that has become extremely viscous. This creates the conditions called elastohydrodynamic regime. The physical behaviour of the lubricant and the opposing surfaces being radically different in elastohydrodynamic regime, thus explaining why the optimisation of a surface texturizing for contact takes place very differently than for the case of other lubricated interfaces.

BRIEF SUMMARY OF INVENTION

The originality of the present invention thereby consists of the successful optimisation, in terms of friction and wear, of a surface texturizing for contacts operating at least partially in elastohydrodynamic regime.

To solve this problem, the contact surface is subjected to operations for producing a periodic network of micrometric cavities having predefined shapes and sizes and whereof the period is adapted to the width of the contact surface in order to promote the passage to elastohydrodynamic lubrication regime.

According to other features, the micrometric cavities consist advantageously, but not limitatively, of holes and/or grooves. The depth of the cavities is less than or equal to 10 µm, and advantageously less than 3 µm and less than 1 µm. The major length of these cavities is between 5 and 500 µm.

To solve the problem of obtaining a textured surface according to the features of the invention, the periodic network of cavities is obtained particularly by a femtosecond laser pulse machining method or by an ion beam method, or by micromachining, or by plastic deformation, or by chemical attack, or by electroerosion.

Advantageously, the friction part whereof the surface is textured, is subjected, before or after texturizing, to a case hardening treatment having a tribological function. This treatment is advantageously obtained by the deposition of a thin layer of amorphous carbon (DLC), to limit the damage of the surfaces and lower the friction coefficient before the passage of the heavily loaded friction parts into elastohydrodynamic lubrication.

As stated above, the texturizing of the friction surface can be obtained by various methods. Femtosecond laser pulses serve to remove matter by sublimation without significantly changing the microstructure. It should be noted however that micromachining techniques (lithography, microerosion) or plastic surface deformation (knurling, micropercussion) or electrochemical techniques (chemical attack, electroerosion) serve to obtain similar results. The periodic patterns prepared on the textured surfaces constitute cavities which can be defined according to the following four essential parameters:

the shape in the plane of the surface (circular, elliptical, square, triangular, groove, etc.);

the profile in the thickness of the material (cylinder, hemisphere, cone, etc.);

the dimensions (diameter, width, depth, etc.);

the period considered in all directions, and with regard to the surface friction direction.

The depth of the cavities is advantageously less than 3 μm in order to limit the damage to the thin layers and to maximize their influence on the lubrication regime, with an optimum result observed for patterns of around 500 nm with more or less 250 nm depth. It may be observed that the textured parts of the invention can be treated before or after texturizing by conventional thermochemical treatment (cementing, carbonitriding, and other diffusion or conversion treatments) or vacuum deposition obtained by PVD (Physical Vapour Deposition) or PACVD (Plasma Assisted Chemical Vapour Deposition), such as nitrides and carbides of transition metals or deposits of amorphous carbon (DLC).

These various dimensions and orientations of the patterns are adapted to the parts to be treated, according to the dimensions of the contact surfaces, the direction and speed of sliding, the contact pressures and the curvature of the parts treated. For example, on mechanical parts subjected to very high contract pressures, such as rocker parts in the automobile field, it is necessary to provide shallow pattern depths of about 500 nm.

It should be noted that the addition of a hard layer, as indicated above, with regard to an uncoated textured surface, serves inter alia to significantly reduce the damage to the patterns over time and, in consequence, to maintain the tribological performance of the textured surfaces. It is also observed that in addition to an influence on the lubrication regime, texturizing also serves unexpectedly to block the propagation of cracks issuing from the localized detachment of the deposit.

BRIEF DESCRIPTION OF THE DRAWING FIGURES

The invention is discussed in greater detail below in conjunction with the figures appended hereto in which.

DETAILED DESCRIPTION

Figure 2:
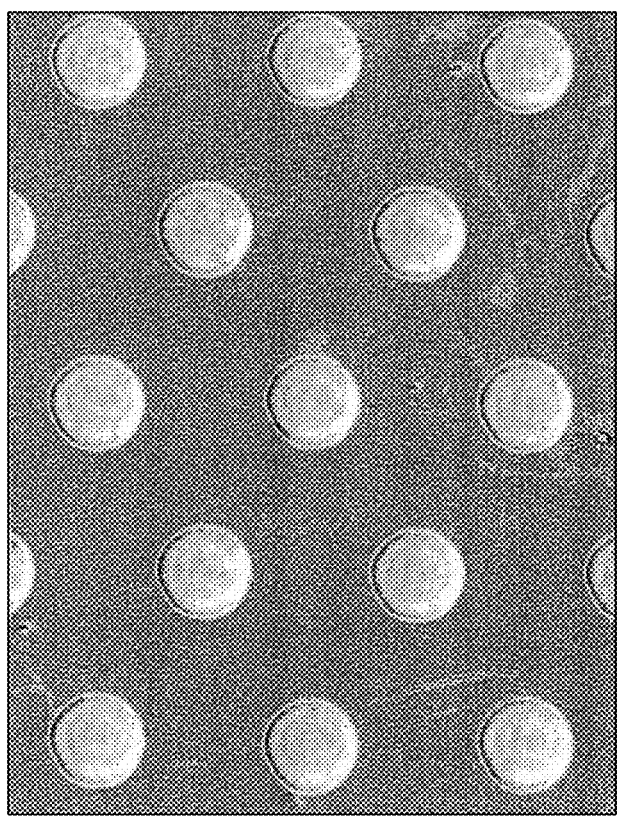
FIG. 2 shows an example of a surface textured by a network of holes.

Reference can be made to example No. 1 of the treatment below:

The parts treated are rollers with a spherical bearing surface 50 mm in diameter, made from tribofinished X85WCrMoV6-5-4-2 steel. These parts have been coated with a 2 μm thick DLC deposit, in which holes (circular microcavities) have been prepared by femtosecond laser pulses. The surfaces are textured by a network of holes 79 μm in diameter and 400 nm deep, with a spacing of 125 μm, as shown in FIG. 2. The network consists of a succession of rows of 7 and 8 offset holes, on a 1 mm wide strip placed at the centre of the roller friction track.

These rollers are used for friction tests on a "Amsler" machine (reference tribological test for a person skilled in the art), under high contact pressures (1 to 3.2 GPa maximum contact pressure), sliding speeds from 0.2 to 2 m/s, and low lubricant entrainment speeds in the contact (10% of the sliding speed). Each textured part has been tested opposite an uncoated and untextured roller, in order to observe the influence of the texturizing on the friction coefficient in lubricated regime (10W40 engine oil), and to examine the service behaviour of the coatings on the different contact pressures. A roller coated with DLC but not textured was also tested opposite an uncoated and untextured roller, to serve as a reference, and accurately pinpoint the effect of the texturizing tested on the contact performance.

In order to quantify the gain obtained by the microtexturizing, friction tests were performed by progressively decreasing the sliding speed in order to break the oil film, at constant applied load.

The performance on tests on coated smooth surfaces, already leading to a gain in the friction coefficient with regard to the same surfaces but without DLC deposit, the surfaces coated with DLC with this pattern under a contact pressure of 2 GPa revealed a significant gain in the friction coefficient.

Figure 1:
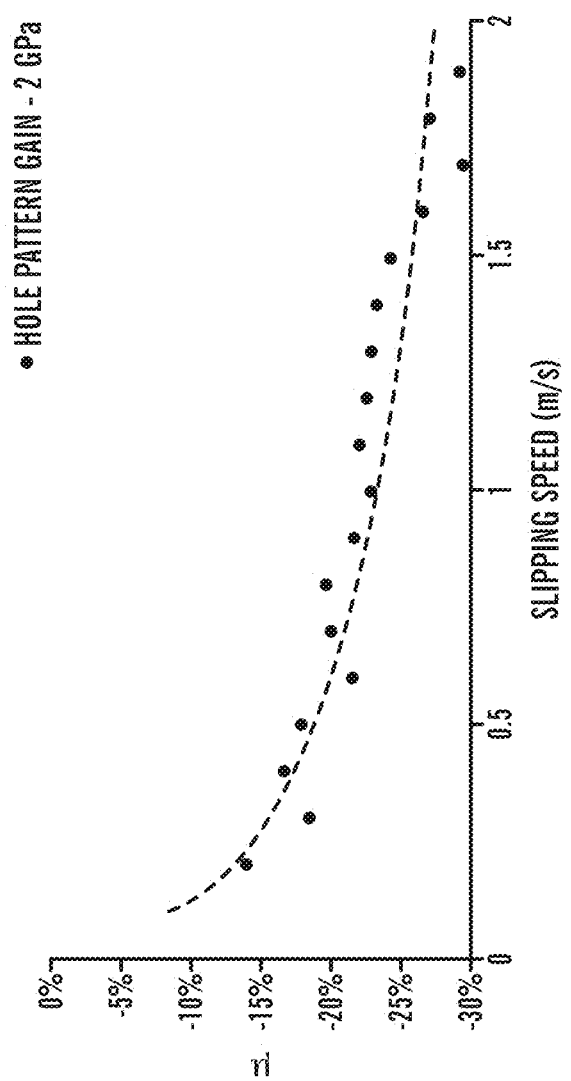
FIG. 1 is a graph showing the gain provided by the patterns of the textured surface.

The graph in FIG. 1 appended hereto shows the variation in the gain obtained by this particular pattern on the friction coefficient (in comparison with the same test but without texturizing) as a function of the sliding speed of the opposing parts in an oil bath. It may be observed that under this contact pressure of 2 GPa, the friction coefficient can be reduced by 30% by this pattern compared with a coated but untextured surface. Incidentally, the preparation of an untextured DLC deposit already serves to reduce the friction coefficient by 15% compared to a polished untreated steel surface.

In this precise configuration, the application of a textured deposit leads to a reduction in power consumption by friction of 30 W and also serves to reduce the overheating of the surfaces and of the oil, which enhances the durability of the component.

Example of Treatment No. 2:

By strictly following the same procedure as for the treatment example 1, whether for the coating and the texturizing of the test roller friction track, as for the performance of the tests on the Amsler machine, a second series of friction tests was conducted at various contact pressures.

Figure 3:
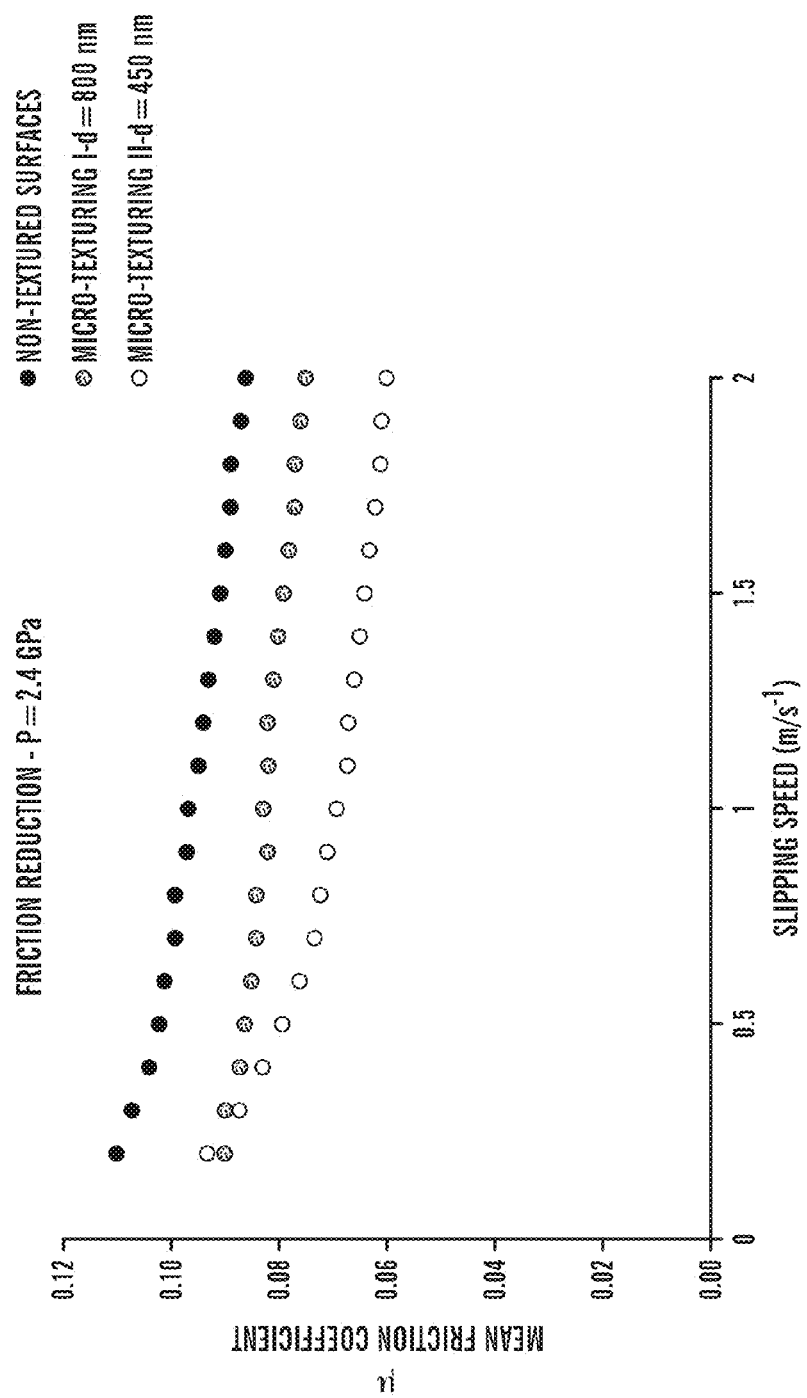
FIG. 3 shows the friction measurements obtained when the maximum contact pressure is kept constant at 2.4 GPa.

FIG. 3 shows the friction measurements obtained, when the maximum contact pressure is kept constant at 2.4 GPa, and for different imposed sliding speeds.

A first roller with a spherical bearing surface was coated with DLC, then textured by following the network of circular microcavities as described in treatment example No. 1. The depth of the microcavities was increased to 5 μm, this value being an example representing what is commonly used by a person skilled in the art. After starting the test with the application of the normal imposed contact force, the destruction of the opposing surfaces by delamination of the DLC deposit and seizure of the surfaces occurred after only 25 seconds. The surface texturizing as normally carried out is therefore inappropriate for this elastohydrodynamic contact.

The other three tests performed subsequently at this contact pressure of 2.4 GPa are shown in FIG. 3. The friction curves obtained thus clearly show that the optimization of the dimensions, and in particular of the depth "d" of the microcavities for values set advantageously at 800 nm, and even more advantageously at 450 nm, serve to obtain a significant reduction in the friction generated at the contact.

The purpose was to dimension the depth of the microcavities as a function of the thickness of the oil film between the contact surfaces, calculated by conventional analytical formulas of the theory of elastohydrodynamic lubrication. This depth is advantageously between 0.1 and 10 times the thickness of the lubricant film calculated theoretically.

Unexpectedly, FIG. 3 thus clearly shows that the choice of the cavity depth set at 450 nm serves to systematically reduce the energy dissipated by friction, ranging from 15% to 35%, compared to the same surface without microtexturizing.

The comparative tests between the roller with a surface coated with untextured DLC, and the roller with a surface coated with DLC having the 450 nm depth texturizing, were then continued, by setting the maximum contact pressure at higher values, that is 2.6 GPa, 2.8 GPa, 3 GPa, and 3.2 GPa.

During the first test at pressure kept constant at 2.6 GPa, the coated and untextured surface of the reference roller is destroyed immediately by delamination of the DLC deposit followed by seizure of the opposing surfaces. The value of 2.6 GPa, is thus retained as the maximum contact pressure limit that can be withstood by the reference surface without texturizing.

In comparison, the test performed in strictly the same conditions was completed without damage, with the coated surface and having the 450 nm depth texturizing.

Similarly, this test was then repeated three times using this roller textured to a depth of 450 nm, and by further increasing the contact pressure kept constant at 2.8 GPa for the first time, 3.0 GPa the second time, and 3.2 GPa the third time.

Unexpectedly, the friction surface of this roller having the most advantageous texturizing was not damaged at the end of this series of tests, and one can therefore conclude that the optimised texturizing according to our invention serves to considerably increase the ability of a surface to withstand the contact pressure that is applied to it.

Surprisingly, in addition to reducing the energy dissipated by friction, the invention thereby serves to confer on the surface better load resistance, and thereby substantially increases its service life.

Example of Treatment No. 3:

The parts treated are rectangular and flat plates measuring 30 mm×18 mm, and 8 mm thick, made from X85WCrMoV6-5-4-2 steel. These parts were coated with a 2 µm thick DLC deposit, in which holes (circular microcavities) were produced by femtosecond laser pulses. The surfaces were textured by a network of holes 79 µm in diameter, with a spacing of 125 µm, as shown in FIG. 2. The network consisted of a succession of rows of offset holes, covering the entire friction surface. Two plates were textured according to this description, one with microcavities 1200 nm deep, the other with microcavities 600 nm deep. A third reference plate was coated with the same DLC deposit strictly, but was not textured. The influence of the two surface texturizings carried out on the contact performance can thus be isolated for comparison with the coated and smooth plate.

These plates were then used for friction tests on a "cylinder/plane" machine. This device serves to contact a cylinder made from X85WCrMoV6-5-4-2 steel having an external friction track 35 mm in diameter, and 8 mm wide, with a plate as defined in the preceding paragraph. The cylinder is rotated about its own axis. The plate is secured on a rig making it undergo a horizontal back-and-forth movement, in the direction of the major dimension. The contact line established between the outer surface of the cylinder and the surface of the plate thus makes round trips on the treated plane surface. A pneumatic cylinder serves to apply a standard load to the rig supporting the plate, and thereby generate a high contact pressure between the plate and the cylinder in movement. The two solids in contact are enclosed in a tank filled with 10W40 engine oil, heated and temperature-controlled.

The tests described were performed successively for different constant forces applied to the contact, that is 40 daN, 80 daN, 120 daN, then 160 daN, by lowering the speed of rotation of the cylinder in successive increments from 1000 rpm to 100 rpm (giving a sliding speed respectively of between 2 m/s and 0.2 m/s). This speed lowering thus serves to reduce the thickness of the oil film between the opposing surfaces, and to promote the transition between the elastohydrodynamic lubrication regime and the mixed regime.

Figure 4:
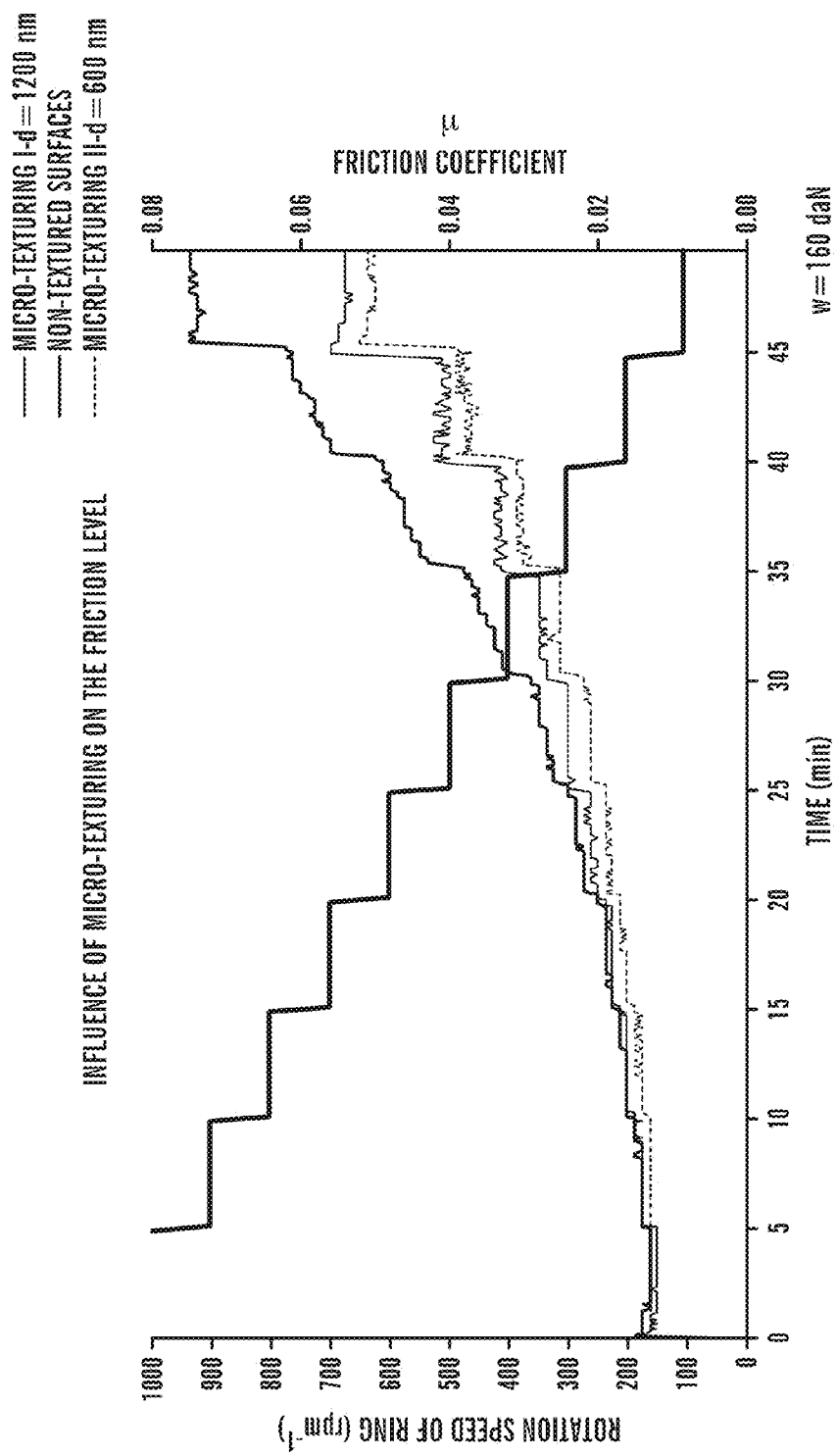
FIG. 4 shows three friction curves showing the influence of a microtexturizing on the friction level.

For the standard load tested and kept constant at 160 daN (generating a maximum contact pressure of 700 MPa), the friction measurements obtained are plotted in FIG. 4.

Unexpectedly, in comparison with the three friction curves in FIG. 4, it is observed that the optimised texturizing according to our invention, and advantageously having a depth "d" of 600 nm, serves here to systematically reduce the measured friction coefficient. This reduction of the energy dissipated by friction reaches up to 30% here, when the lubrication conditions are the most severe.

The application of the surface texturizing according to the invention presented here serves to shift the transition between elastohydrodynamic regime and mixed regime towards more severe operating conditions.

This decrease in friction is again obtained by adjusting the dimensions, and in particular, the depth of the microcavities "d", which must advantageously be between 0.1 and 10 times the thickness of the lubricant film.

The advantages of the invention illustrated by these three examples clearly appear from the description, and in particular, it is emphasized and recalled that it:

significantly reduces the friction coefficient in clearly defined operating conditions by favouring the transition to elastohydrodynamic lubrication regime;

increases the maximum contact pressure permissible by the treated surface, before its destruction;

limits the damage to the deposit by confinement of the flakes between two periods of the pattern prepared, and by removal of the worn particles in the cavities;

increases the durability of the mechanical parts, by limiting their wear.

The invention finds a particularly advantageous application in connection with a lubrication in elastohydrodynamic regime of heavily loaded friction parts (contact pressures above 0.2 MPa, above 0.5 MPa, above 0.8 MPa), particularly in the automobile field and more particularly for producing engine components, in particular of rockers such as levers or tappets in the field of leisure or racing vehicles.

The invention also finds an advantageous application in connection with the lubrication in elastohydrodynamic regime of heavily loaded friction parts of power transmissions, particularly for the treatment of gear teeth, used in particular in gearboxes for leisure or racing vehicles.

The invention claimed is:

1. Friction part in a lubricated medium operating at contact pressures above 200 MPa and having a contact surface comprising a textured layer of deposited hard material, wherein said surface has a periodic network of micrometric cavities having a maximum length between 5 and 500 µm, a period less than half of a width of the contact surface, and a depth that is less than a thickness of said layer, correlated to a thickness of an employed lubricant so as to optimize reduction of friction coefficient and less than or equal to 3 µm, at elastohydrodynamic lubrication regime.

2. Part according to claim 1, wherein the micrometric cavities comprise grooves.

3. Part according to claim 1, wherein the depth of the cavities is lower than or equal to 1 µm.

4. Part according to claim 1, wherein the periodic network of the cavities is obtained by a femtosecond laser pulse machining method.

5. Part according to claim 1, wherein the periodic network of the cavities is obtained by micromachining.

6. Part according to claim 1, wherein the periodic network of the cavities is obtained by plastic deformation of the surface.

7. Part according to claim 1, wherein the periodic network of the cavities is obtained by chemical attack or electroerosion.

8. Part according to claim 1, wherein the periodic network of the cavities is obtained by an ion beam machining method.

9. Part according to claim 1, wherein the layer comprises amorphous carbon (DLC).

10. Part according to claim 1 deployed in an automobile.

11. Part according to claim 1, the part being subjected during all or part of operation to maximum contact pressures above 0.5 GPa, the layer having a thickness not exceeding 5 µm, and the micrometric cavities having a depth less than 1 µm.

12. Part according to claim 1, the part being subjected during all or part of operation to maximum contact pressures above 0.8 GPa, the layer having a thickness not exceeding 5 µm, and the micrometric cavities having a depth less than 1 µm.

13. Part according to claim 1, wherein depth of the micrometric cavities is between 0.1 and 10 times a thickness of lubricant film between contact surfaces.

14. Part according to claim 1, wherein depth of the micrometric cavities is in a range of 500 µm plus or minus 250 µm.

15. Part according to claim 1, wherein the depth of the micrometric cavities results in a 30% reduction in the friction coefficient compared with a hardened but untextured surface.

16. Friction part in a lubricated medium operating at contact pressures above 200 MPa and having a contact surface comprising a textured layer of at least one of a transition metal nitride and amorphous carbon, the layer having a thickness that does not exceed 5 µm, wherein said surface has a periodic network of micrometric cavities having a maximum length between 5 and 500 µm, a period less than half of a width of the contact surface, and a depth that is less than a thickness of said layer, correlated to a thickness of an employed lubricant so as to optimize reduction of friction coefficient, and in a range of 500 µm plus or minus 250 µm, at elastohydrodynamic lubrication regime.

17. Part according to claim 16, wherein said layer has a thickness of 2 µm.

* * * * *